(12) United States Patent
Milo et al.

(10) Patent No.: US 9,761,536 B1
(45) Date of Patent: Sep. 12, 2017

(54) ANGLE REFERENCED LEAD FRAME DESIGN

(71) Applicant: Texas Instruments Incorporated, Dallas, TX (US)

(72) Inventors: Dolores Babaran Milo, Baguio (PH); Ernesto Pentecostes Rafael, Jr., Cuyapo (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/133,375

(22) Filed: Apr. 20, 2016

(51) Int. Cl.
*H01L 23/544* (2006.01)
*H01L 23/495* (2006.01)
*H01L 23/00* (2006.01)

(52) U.S. Cl.
CPC ...... *H01L 23/544* (2013.01); *H01L 23/49503* (2013.01); *H01L 23/49541* (2013.01); *H01L 24/83* (2013.01); *H01L 2223/54426* (2013.01); *H01L 2224/83132* (2013.01); *H01L 2924/14* (2013.01); *H01L 2924/17747* (2013.01)

(58) Field of Classification Search
CPC ............. H01L 23/544; H01L 23/49503; H01L 23/49541; H01L 24/83
See application file for complete search history.

(56) References Cited

U.S. PATENT DOCUMENTS 5,844,306 A * 12/1998 Fujita ................ H01L 23/49503
257/666
2003/0183917 A1* 10/2003 Tsai .................... H01L 23/3218
257/686

* cited by examiner

*Primary Examiner* — Errol Fernandes
(74) *Attorney, Agent, or Firm* — Jacqueline J. Garner; Charles A. Brill; Frank D. Cimino

(57) ABSTRACT

A lead frame with an IC chip pad with an alignment notch. A method of mounting a packaged IC chip on a lead frame at a precise angle by aligning a corner of the packaged IC chip to an alignment notch on the lead frame.

25 Claims, 6 Drawing Sheets

ANGLE REFERENCED LEAD FRAME DESIGN

FIELD

This disclosure relates to the field of integrated circuit packaging. More particularly, this disclosure relates to lead frames used to mount Quad Flat No lead (QFN) packages.

BACKGROUND

An example lead frame 100 for a Quad Flat No Lead (QFN) is shown in FIG. 1. The lead frame consists of a central integrated circuit (IC) chip pad 102 surrounded on all sides by leads 104 which are electrically isolated from the IC chip pad 102. The lead frame 100 is typically formed of copper or a copper alloy.

As shown in FIG. 2 an IC chip 202 attached to the IC chip pad 102 may be electrically connected to the leads 104 with bond wires 206 which are connected between bond pads 204 on the IC chip 202 and the leads 104.

As is illustrated in FIG. 3, when the IC chip 202 is mounted on the IC chip pad 102 in a non-rotated fashion (corners of the IC chip aligned to the corners of the IC chip pad 102), in order for bond wires 206 to be connected to the correct lead 104 they may become crossed resulting in shorts 306.

As shown in FIG. 4 the crossing of the bond wires 206 may be avoided by mounting the IC chip 202 on the IC chip pad 102 in a rotated position.

Alternatively as shown in FIG. 5, a special lead frame with the central IC chip pad 102 in the rotated position may be manufactured. This design allows the packaged IC mounting tool to align the corners of the IC chip 202 to the corners of the IC chip pad 102.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A lead frame with an IC chip pad with an alignment notch is described. A packaged IC chip is mounted on a lead frame at a precise angle by aligning a corner of the packaged IC chip to an alignment notch on the lead frame.

DETAILED DESCRIPTION OF EXAMPLE EMBODIMENTS

Embodiments of the disclosure are described with reference to the attached figures. The figures are not drawn to scale and they are provided merely to illustrate the disclosure. Several aspects of the embodiments are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The embodiments are not limited by the illustrated ordering of acts or events, as some acts may occur in different orders and/or concurrently with other acts or events. Furthermore, not all illustrated acts or events are required to implement a methodology in accordance with the present disclosure.

Figure 1:
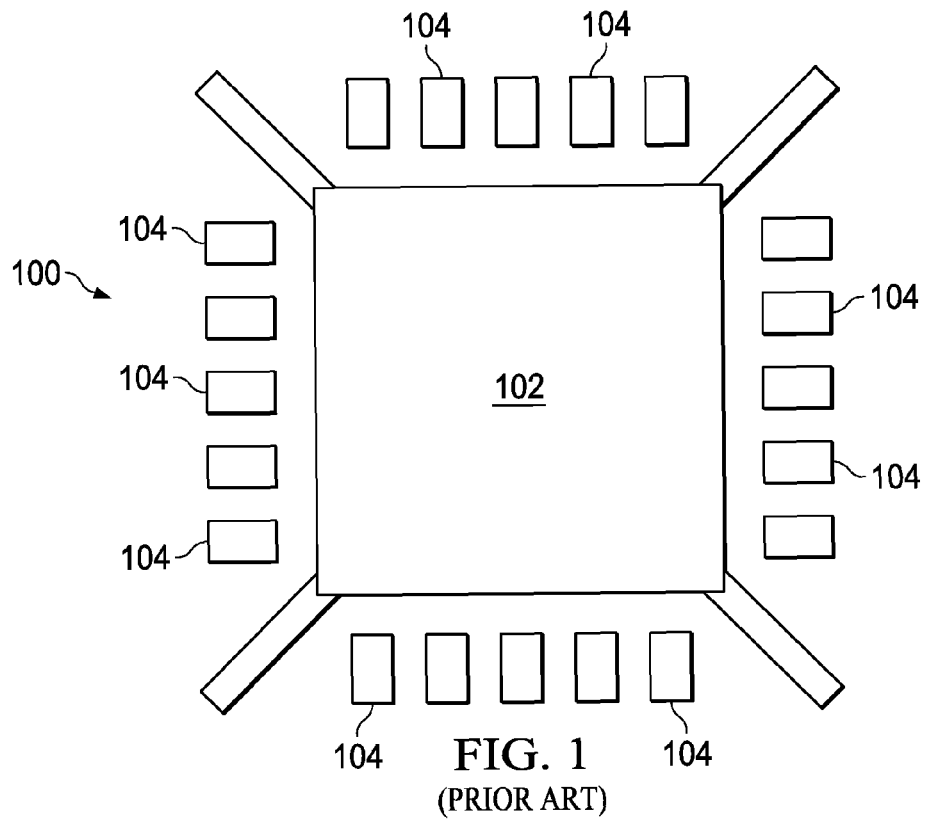
FIG. 1 (Prior art) is a plan view of a conventional lead frame.
Figure 2:
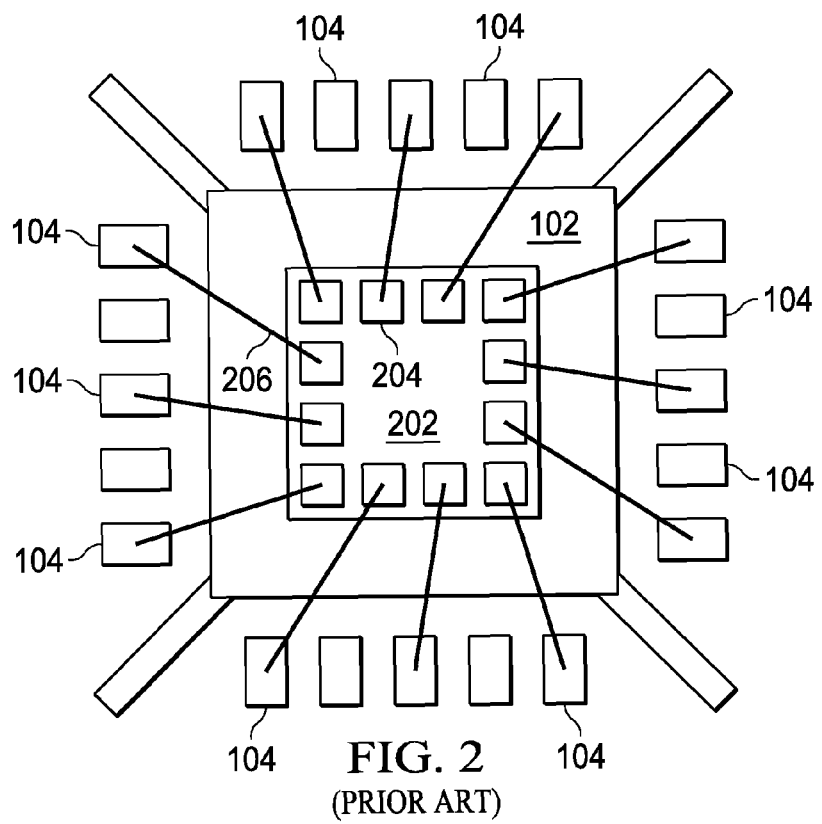
FIGS. 2, 3, 4 (Prior art) are plan views of a conventional lead frame with a mounted IC chip and wire bonds.
Figure 3:
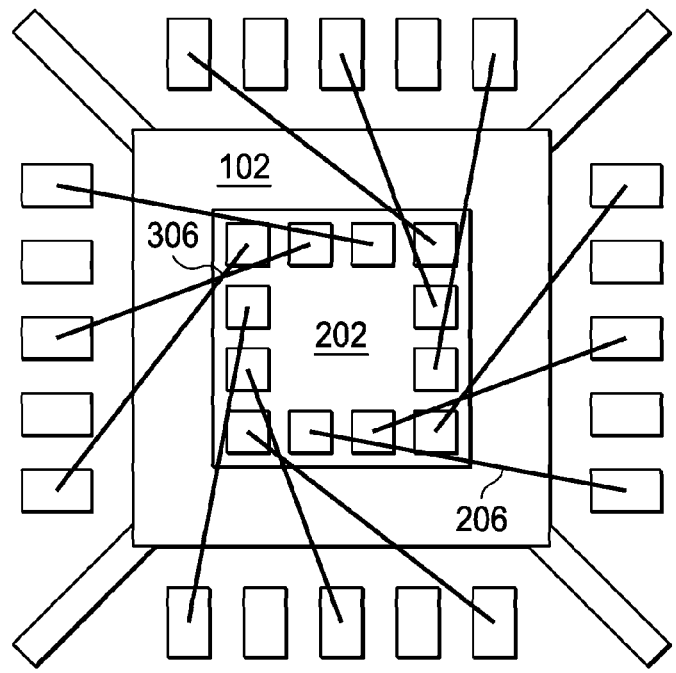
Figure 4:
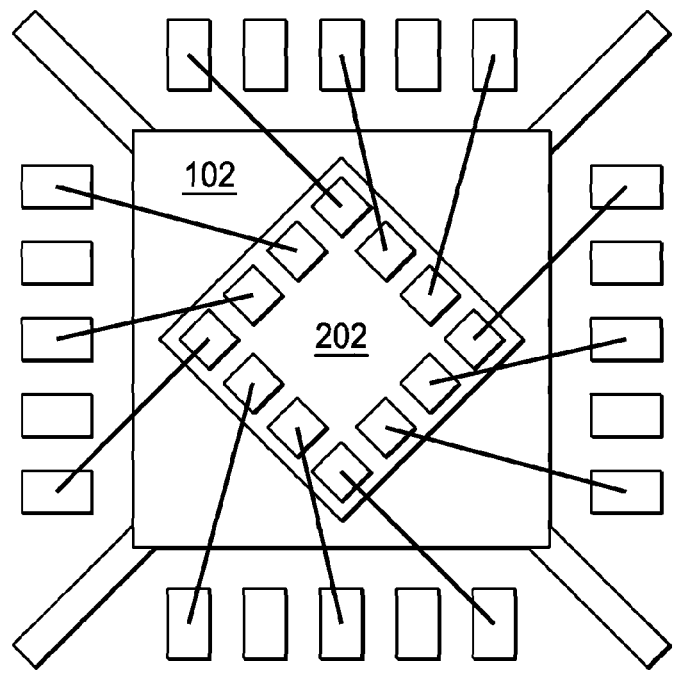
Figure 5:
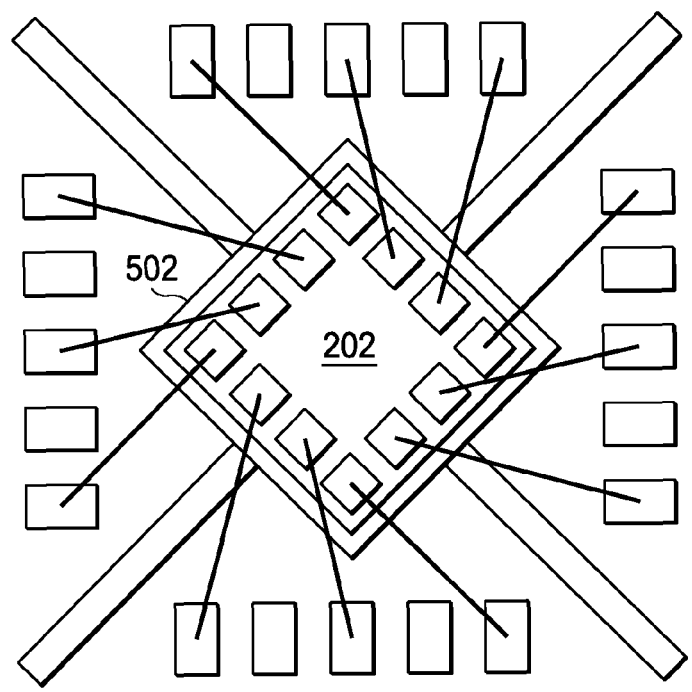
FIG. 5 (Prior art) is a plan view of a conventional lead frame with a rotated IC chip pad.
Figure 6:
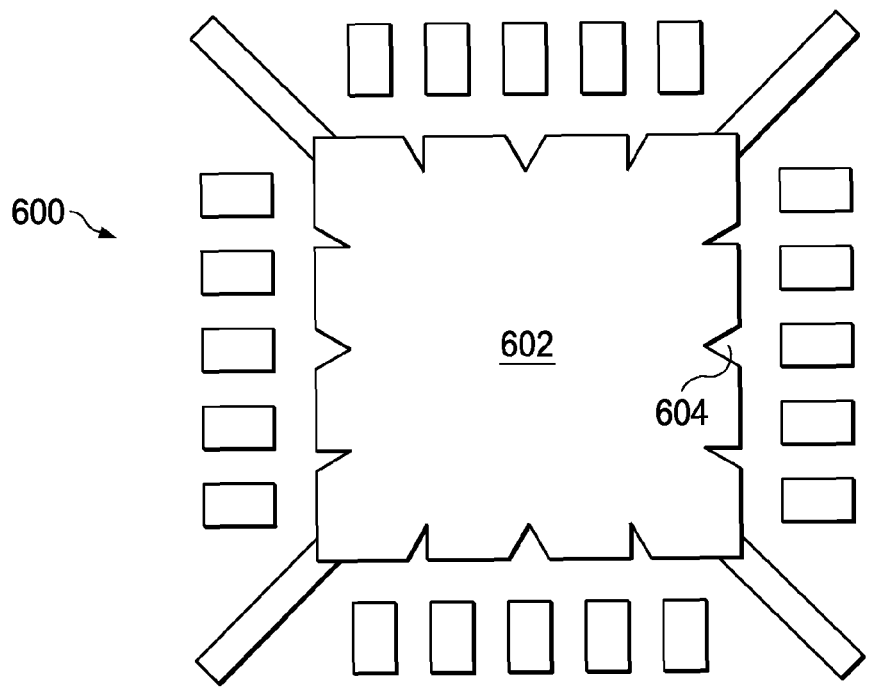
FIG. 6 is a plan view of an embodiment lead frame formed according to the principles of the disclosure.

An embodiment angle referenced lead frame is illustrated in FIG. 6. In this embodiment, 4 sets of alignment notches 604 are cut into the sides of the centrally located IC chip pad 602. These alignment notches 604 provide reference points that the packaged IC chip placement tool can use when mounting the packaged IC chip in a rotated position. In the illustrative example, alignment notches 604 are cut into the periphery of the IC chip pad 602 to enable the packaged IC mounting tool to affix IC chips with precision at rotation angles of 0°, 30°, 45°, 60°, 90° by aligning them with the alignment notches 604. Embodiment angle referenced lead frames 600 with other angles may be manufactured as needed. The embodiment angled referenced lead frame 600 enables one lead frame to be used for the mounting of packaged IC chips with consistency at a number of different rotations. This avoids the cost of having to manufacture a separate lead frame for each different rotation angle. In addition the embodiment angled reference lead frame 600 significantly reduces variation in the angle of rotated and mounted IC chips by providing alignment reference points for the IC chip mounting tool to utilize.

Figure 7A:
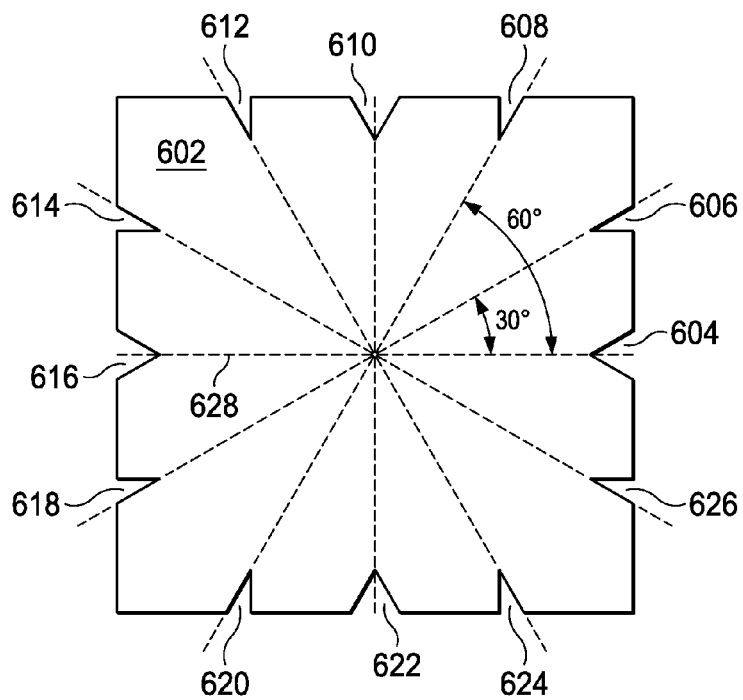
FIG. 7A is a plan view of the embodiment shown in FIG. 6 showing embodiment angle referenced lead frame, with three sets of four alignment notches.

Shown in FIG. 7A is an IC chip pad 602 from and embodiment angle referenced lead frame 600, with three sets of four alignment notches. A first set of four alignment notches, 604, 610, 616, and 622, are formed at the midpoints on each of the four sides of the IC chip pad 602. A horizontal line drawn through the alignment notches 604 and 616 that are formed at the midpoints of the vertical sides of the IC chip pad 602 bisects the IC chip pad 602 into two identical horizontal rectangles. A vertical line drawn through the alignment notches 610 and 622 that are formed at the midpoints of the horizontal sides of the IC chip pad 602 bisects the IC chip pad 602 into two identical vertical rectangles.

Figure 8:
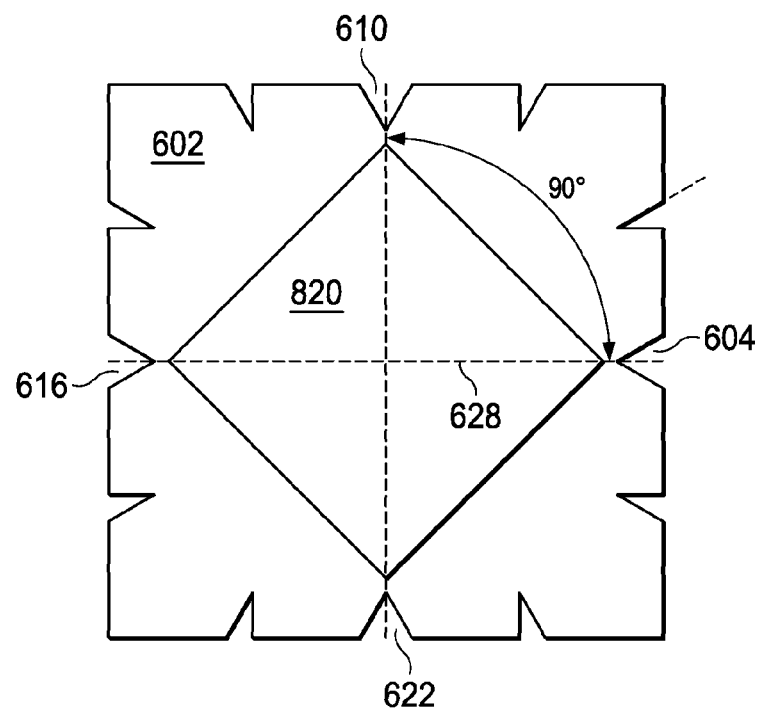
FIGS. 8, 9, 10, 11 are plan views of IC chips that are mounted at a rotated angle to embodiment lead frames formed according to the principles of the disclosure.

As shown in FIG. 8 an IC chip 820 with corners aligned to these alignment notches 604, 610, 616, and 622 is rotated 90 degrees counter clockwise from a reference horizontal line 628 running through the center of the IC chip pad 602.

Figure 9:
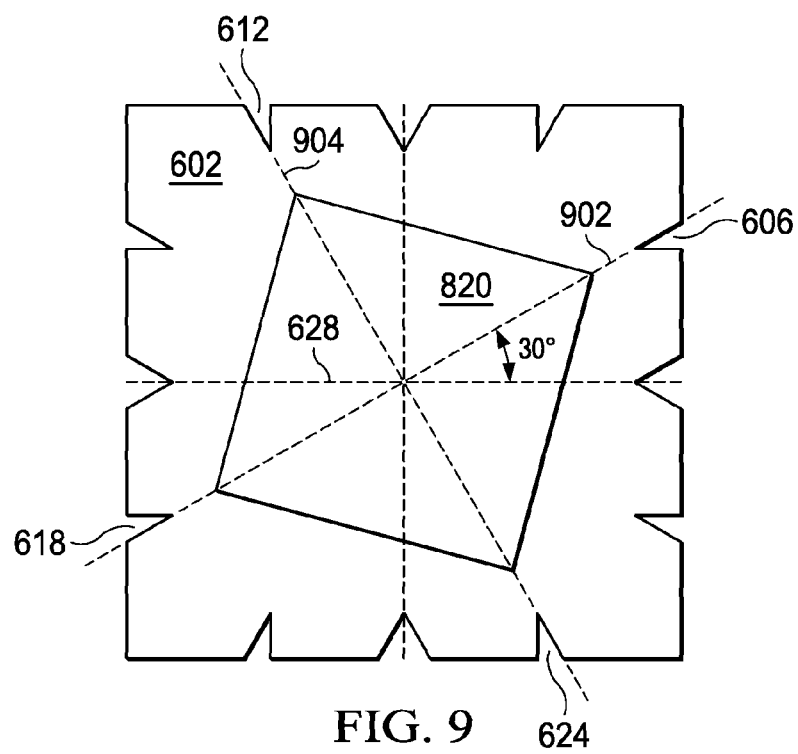

A second set of alignment notches, 606, 612, 618, and 624 facilitate the alignment of an IC chip whose corners are rotated 30° in a counter clockwise direction from horizontal (See FIG. 9). One alignment notch is on each side of the IC chip pad 602. A first line 902 drawn through a first set of 30 degree alignment notches 606 and 618 runs through a first set of opposite corners of the IC chip 602. Alignment notches 606 and 618 are on opposite sides of the IC chip pad 602 and are 180° apart. A second line 904 drawn through a second set of 30 degree alignment notches 612 and 624 runs through a second set of opposite corners of the IC chip 602. Alignment notches 606 and 618 are on opposite sides of the IC chip pad 602 and are 180° apart. The second line 904 is perpendicular to the first line 902. Both lines run through the midpoint of the IC chip pad 602 and the midpoint of the IC chip 820.

Figure 10:
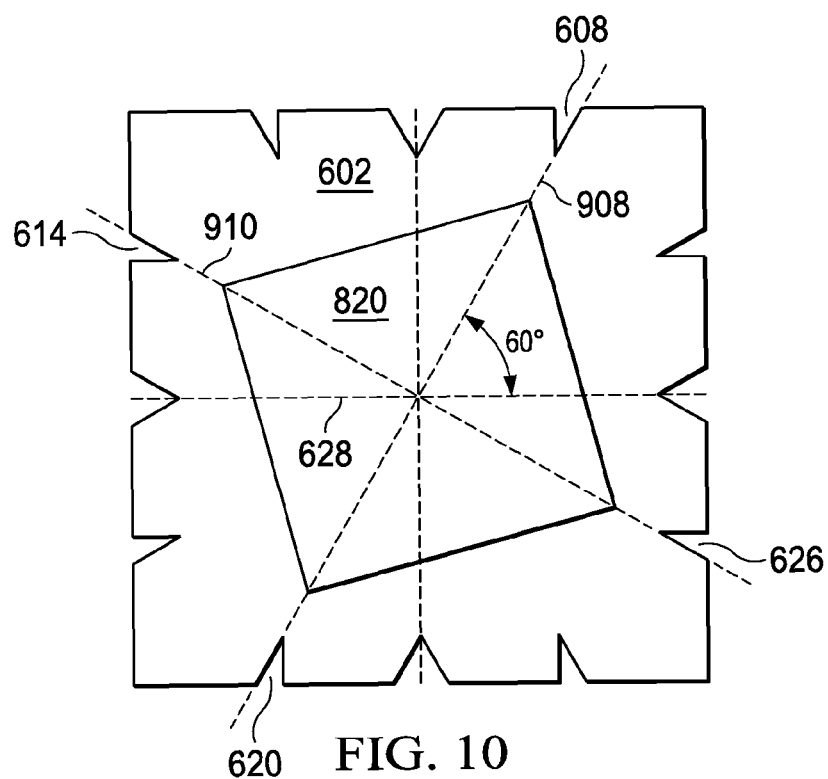

A third set of alignment notches, 608, 614, 620, and 626 facilitate the alignment of an IC chip whose corners are rotated 60° in a counter clockwise direction from horizontal. (See FIG. 10). One alignment notch is on each side of the IC chip pad 602. A first line 908 drawn through a first set of 30 degree alignment notches 608 and 620 runs through a first set of opposite corners of the IC chip 820. Alignment notches 608 and 620 are on opposite sides of the IC chip pad 602 and are 180° apart. A second line 910 drawn through a second set of 30 degree alignment notches 614 and 626 runs through a second set of opposite corners of the IC chip 820. Alignment notches 614 and 626 are on opposite sides of the IC chip pad 602 and are 180° apart. The second line 910 is perpendicular to the first line 908. Both lines run through the midpoint of the IC chip pad 602 and the midpoint of IC chip 820.

Figure 11:
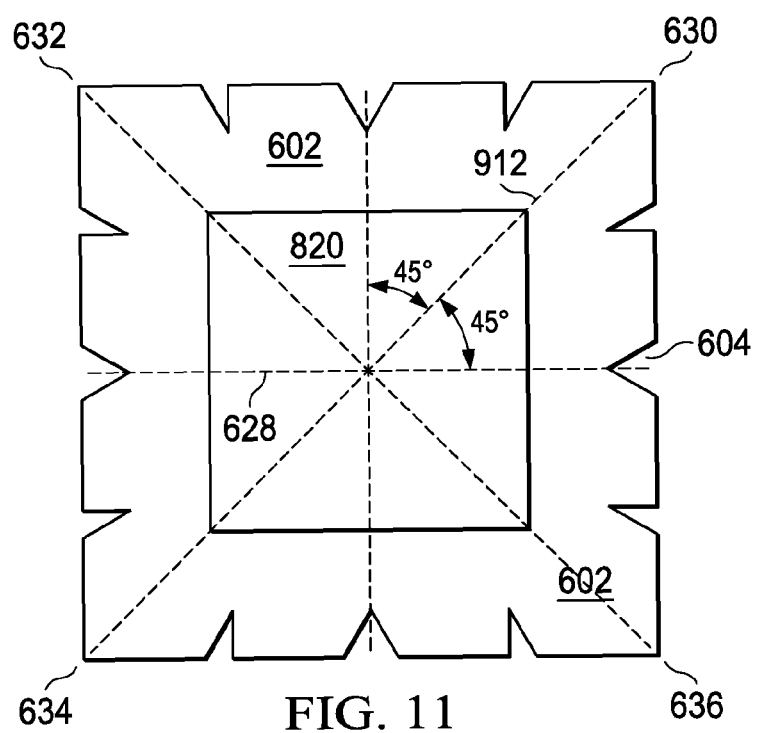

An example IC chip 820 mounted in the conventional non rotated orientation is illustrated in FIG. 11. The corners of the IC chip 820 are aligned to the corners, 630, 632, 634, and 636 of the IC chip pad 602. An angle of 45° is formed between a line 912 through the corners of the IC chip 602 and a reference horizontal line 628.

Figure 7B:
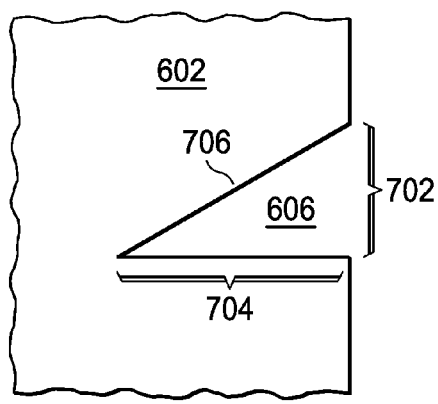
FIG. 7B shows an expanded view of one of the alignment notches in accordance to an embodiment.

FIG. 7B shows an expanded view of one of the alignment notches 606. In this implementation, one side 706 of the alignment notch 606 is angled so that it is parallel to a line drawn through the vertex of the alignment notch 606 and the center point of the IC chip pad 602. This aids the die placement tool in aligning the IC chip 820 to the IC chip pad 602. In this embodiment one side of each alignment notch is formed with the same angle of rotation as a rotationally mounted IC chip 820.

Referring now to FIG. 7B, the width of the notch 702 at the open end of the notch on the edge of the IC chip pad 602 may be in the range of 0.05 mm to 0.1 mm. The depth of the notch 704 from the edge of the IC chip pad 602 to the vertex of the notch may be in the range of about 0.05 mm to 0.1 mm. In an example embodiment the width of the notches is about 0.05 mm and the depth of the notches is about 0.05 mm.

Three sets of 4 alignment notches for a total of 12 alignment notches are used in FIG. 6 to illustrate the embodiment. Any number of alignment notches (1 or more) may be used. At least two alignment notches are preferred to facilitate the mounting of an IC chip for each rotation by the aligning of two of the IC chip corners with the two alignment notches. Even more preferred, four alignment notches are preferred to facilitate the mounting of an IC chip by the aligning of the four IC chip corners with the four alignment notches.

Figure 12:
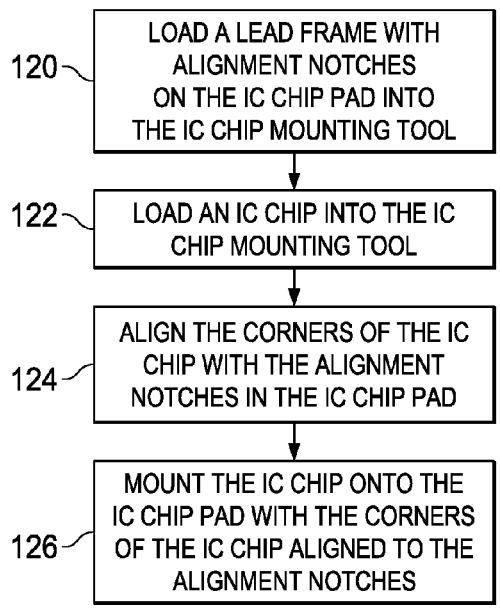
FIG. 12 is a flow diagram of a method for mounting an IC chip in a rotated position to an embodiment lead frame.

The flow diagram in FIG. 12 describes the method for mounting an IC chip in a rotated position on an embodiment lead frame.

In step 120 a lead frame with alignment notches is loaded into the IC chip mounting tool.

In step 122 a packaged IC chip to be mounted on the lead frame is loaded into the IC chip mounting tool.

In step 124, the IC chip mounting tool aligns the corners of the packaged IC chip with the alignment notches.

In step 126, the IC chip mounting tool then mounts the packaged IC chip onto the lead frame with the corners of the packaged IC chip aligned to the alignment notches.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A lead frame, comprising:
    a plurality of leads;
    an IC chip pad; and
    at least one alignment notch in an edge of the IC chip pad, wherein one side of the least one alignment notch is parallel to a line drawn through a vertex of the least one alignment notch and a center point of the IC chip pad.

2. The lead frame of claim 1, wherein the at least one alignment notch includes two alignment notches.

3. The lead frame of claim 2, wherein a first alignment notch of the two alignment notches is in a first edge of the IC chip pad and a second alignment notch of the two alignment notches is in an opposite edge of the IC chip pad and aligned 180 degrees opposite to the first alignment notch.

4. The lead frame of claim 1, wherein the at least one alignment notch includes four alignment notches.

5. The lead frame of claim 4, wherein a first alignment notch is in a first edge of the IC chip pad and a second alignment notch is in a second edge of the IC chip pad and aligned 180 degrees opposite to the first alignment notch and where a third alignment notch is in a third edge of the IC chip and a fourth alignment notch is in a fourth edge of the IC chip pad and aligned 180 degrees opposite to the third alignment notch.

6. The lead frame of claim 1, wherein the at least one alignment notch includes multiple sets of four alignment notches and wherein each of the four alignment notches, of each set of the multiple sets, is on a separate edge of the IC chip pad and wherein each alignment notch is 180 degrees opposite another alignment notch.

7. The lead frame of claim 1, wherein an opening of the least one alignment notch in the edge of the IC pad is in the range of 0.05 to 0.1 mm.

8. The lead frame of claim 1, wherein a vertex of the least one alignment notch from the edge of the IC pad is in the range of 0.05 to 0.1 mm.

9. The lead frame of claim 1, wherein a line drawn through a vertex of the least one alignment notch and a center point of the IC chip pad forms a 30° angle to a horizontal line.

10. The lead frame of claim 1, wherein a line drawn through a vertex of the least one alignment notch and a center point of the IC chip pad forms a 60° angle to a horizontal line.

11. The lead frame of claim 1, wherein a line drawn through a vertex of the least one alignment notch and a center point of the IC chip pad forms a 90° angle to a horizontal line.

12. A method of mounting an IC chip on a lead frame comprising:
placing the IC chip in an IC chip mounting tool;
aligning a corner of the IC chip to an alignment notch of an IC chip pad of a lead frame, the alignment notch being V shaped;
mounting the IC chip on the IC chip pad; and
electrically connecting the IC chip to leads of the lead frame.

13. The method of claim 12 wherein sides of the IC chip are rotated with respect to sides of the IC chip pad.

14. The method of claim 12 wherein sides of the IC chip are rotated with respect to sides of the IC chip pad with an angle of 30 degrees.

15. The method of claim 12 wherein sides of the IC chip are rotated with respect to sides of the IC chip pad with an angle of 45 degrees.

16. The method of claim 12 wherein sides of the IC chip are rotated with respect to sides of the IC chip pad with an angle of 60 degrees.

17. The method of claim 12, further comprising:
aligning two alignment notches on two opposite sides of the IC chip pad where the two alignment notches are 180° from each other on a line drawn through both alignment notches and through a center point on the IC chip pad; and
aligning two opposite corners of the IC chip with the two alignment notches.

18. The method of claim 12, further comprising:
aligning a first set of two alignment notches of four alignment notches with a first set of two opposite sides of the IC chip pad where the first two alignment notches are 180° from each other on a line drawn through both alignment notches and through a center point on the IC chip pad;
aligning a second set of two alignment notches of the four alignment notches with a second set of two opposite sides of the IC chip pad where the second two alignment notches are 180° from each other on a line drawn through both alignment notches and through a center point on the IC chip pad, wherein each of the four alignment notches are on separate edges of the IC chip pad.

19. A packaged integrated circuit (IC) comprising:
a lead frame including:
a plurality of leads;
an IC chip pad; and
at least one alignment notch in an edge of the IC chip pad, the at least one alignment notch being V shaped; and
an IC chip mechanically connected to the IC chip pad and electrically connected to the plurality of leads.

20. The lead frame of claim 19, wherein the at least one alignment notch includes two alignment notches.

21. The lead frame of claim 20, wherein a first alignment notch of the two alignment notches is in a first edge of the IC chip pad and a second alignment notch of the two alignment notches is in an opposite edge of the IC chip pad and aligned 180 degrees opposite to the first alignment notch.

22. The lead frame of claim 19, wherein the at least one alignment notch includes four alignment notches.

23. The lead frame of claim 22, wherein a first alignment notch is in a first edge of the IC chip pad and a second alignment notch is in a second edge of the IC chip pad and aligned 180 degrees opposite to the first alignment notch and where a third alignment notch is in a third edge of the IC chip and a fourth alignment notch is in a fourth edge of the IC chip pad and aligned 180 degrees opposite to the third alignment notch.

24. The lead frame of claim 19, wherein the at least one alignment notch includes multiple sets of four alignment notches and wherein each of the four alignment notches, of each set of the multiple sets, is on a separate edge of the IC chip pad and wherein each alignment notch is 180 degrees opposite another alignment notch.

25. The lead frame of claim 19, wherein one side of the least one alignment notch is parallel to a line drawn through a vertex of the least one alignment notch and a center point of the IC chip pad.

* * * * *